United States Patent
Ohshima et al.

(10) Patent No.: US 7,427,823 B2
(45) Date of Patent: Sep. 23, 2008

(54) PIEZOELECTRIC VIBRATION ELEMENT, PIEZOELECTRIC VIBRATOR, PIEZOELECTRIC OSCILLATOR, FREQUENCY STABILIZATION METHOD, AND METHOD OF MANUFACTURING THE PIEZOELECTRIC VIBRATOR

(75) Inventors: Tsuyoshi Ohshima, Chigasaki (JP); Shin Hasegawa, Chigasaki (JP); Noriyuki Watanabe, Hiratenka (JP)

(73) Assignee: Epson Toyocom Corporation, Tokyo (JP)

( * ) Notice: Subject to any disclaimer, the term of this patent is extended or adjusted under 35 U.S.C. 154(b) by 223 days.

(21) Appl. No.: 11/344,189

(22) Filed: Feb. 1, 2006

(65) Prior Publication Data
US 2006/0170305 A1 Aug. 3, 2006

(30) Foreign Application Priority Data
Feb. 3, 2005 (JP) ............................. 2005-027838

(51) Int. Cl.
*H01L 41/08* (2006.01)
(52) U.S. Cl. ..................................... 310/344
(58) Field of Classification Search .................. 310/312, 310/340, 343, 348, 345
See application file for complete search history.

(56) References Cited

U.S. PATENT DOCUMENTS

| | | | |
|---|---|---|---|
| 4,107,349 A | 8/1978 | Vig | |
| 5,918,354 A | 7/1999 | Ikegami et al. | |
| 2003/0127943 A1* | 7/2003 | Tsuzuki et al. | 310/313 R |
| 2004/0013794 A1* | 1/2004 | Hashimoto et al. | 427/100 |
| 2006/0170305 A1* | 8/2006 | Ohshima et al. | 310/311 |
| 2007/0186689 A1* | 8/2007 | Fukuda et al. | 73/862.68 |
| 2007/0222056 A1* | 9/2007 | Bauer et al. | 257/687 |

FOREIGN PATENT DOCUMENTS

| | | |
|---|---|---|
| CN | 1165432 A | 11/1997 |
| EP | 1 187 323 A1 | 3/2002 |
| EP | 1 471 769 A2 | 10/2004 |
| JP | A-07-154187 | 6/1995 |
| JP | A 2000 022484 | 1/2000 |
| JP | A 2001-332933 | 11/2001 |
| JP | A 2004-56602 | 2/2004 |
| JP | A 2004-343397 | 12/2004 |

OTHER PUBLICATIONS

Iwata et al., "VHF Fundamental At-Cut Resonators Using Flip-Chip Bonding." IEEE International Frequency Control Symposium and PDA Exhibition. Jun. 6-8, 2001. pp. 356-361.
Tanaka et al., "The Electrical Behavior of the Fundamental High Frequency (150 MHz) Quartz Crystal Unit in the Plasmatic Environment." IEEE International Frequency Control Symposium. May 28-30, 1997. pp. 758-764.
Vig et al., "The Aging of Bulk Acoustic Wave Resonators, Filters and Oscillators." 45th Annual Symposium on Frequency Control. May 29-31, 1991. pp. 77-101.
Benson et al., "Volatile Species from Conductive Die Attach Adhesives." IEEE Transactions on Components, Hybrids, and Manufacturing Technology. vol. 12 No. 4. Dec. 1989. pp. 571-577.

* cited by examiner

*Primary Examiner*—Mark Budd
(74) *Attorney, Agent, or Firm*—Oliff & Berridge, PLC

(57) ABSTRACT

A piezoelectric vibration element is provided which includes a piezoelectric substrate formed of a thickness slip based piezoelectric material and a metal layer formed on a surface of the piezoelectric substrate. In the piezoelectric vibration element, a surface of the metal layer is covered by a layer formed by chemical absorption with a material having a non-bonding electron pair.

11 Claims, 5 Drawing Sheets

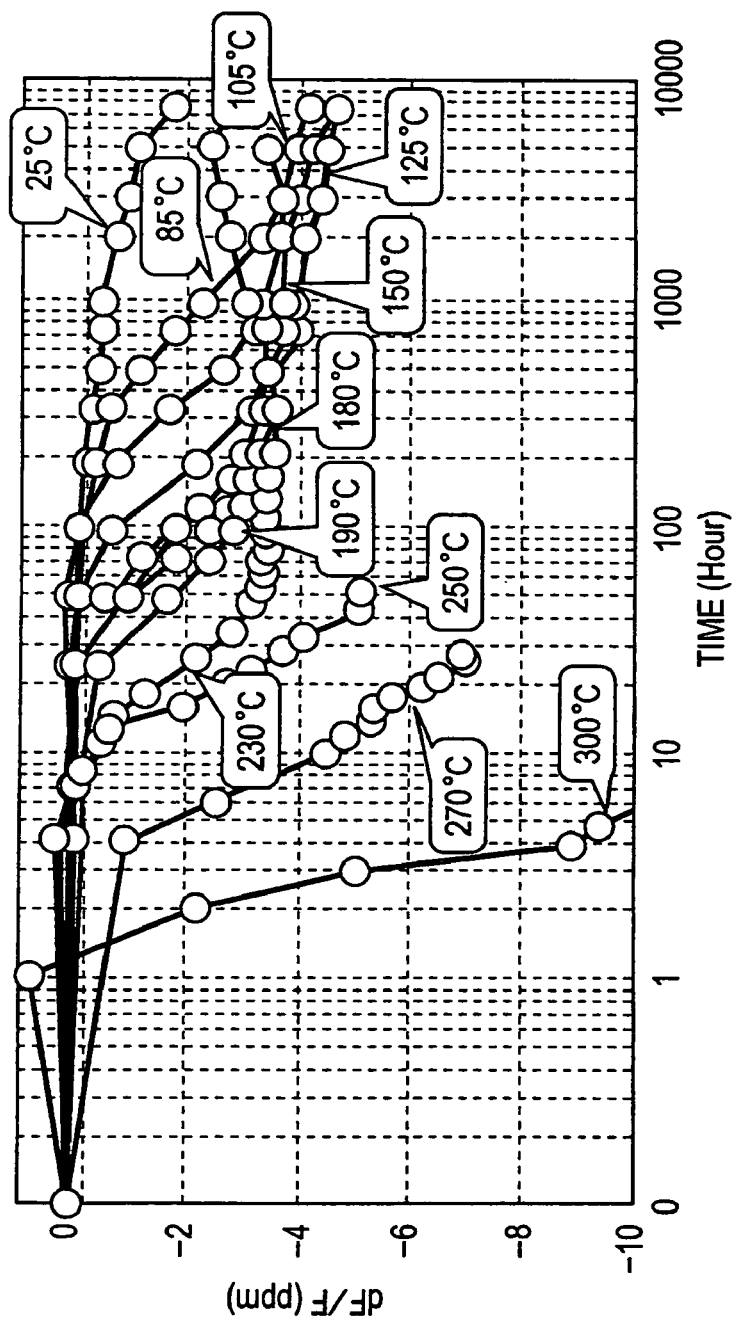

RELATIONSHIP BETWEEN REQUIRED TIME AND HEATING TEMPERATURE UNTIL RESONANT FREQUENCY (26 MHz) BECOMES STABILIZED

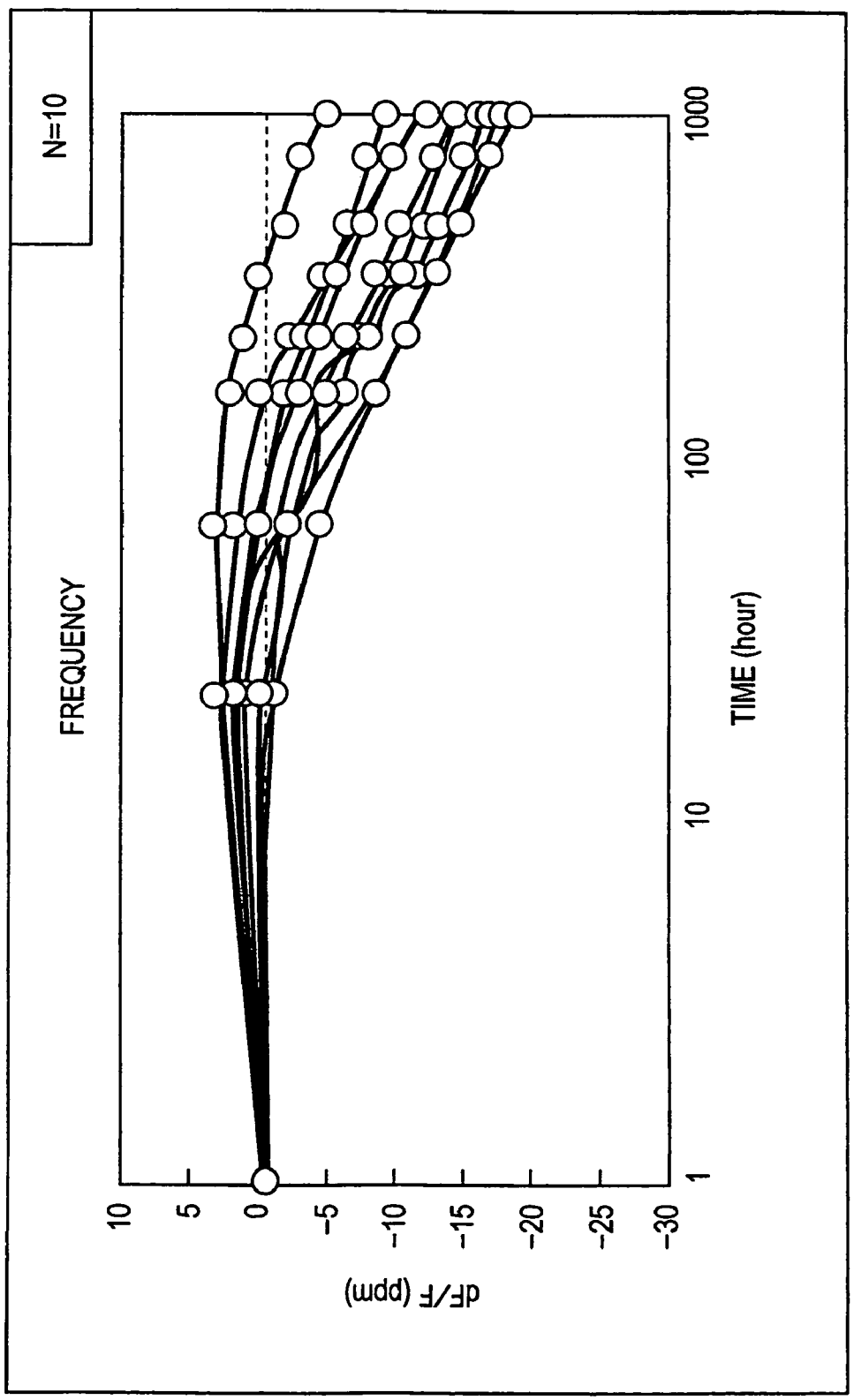

PIEZOELECTRIC VIBRATION ELEMENT, PIEZOELECTRIC VIBRATOR, PIEZOELECTRIC OSCILLATOR, FREQUENCY STABILIZATION METHOD, AND METHOD OF MANUFACTURING THE PIEZOELECTRIC VIBRATOR

BACKGROUND

1. Technical Field

The present invention relates to a piezoelectric vibration element capable of effectively preventing, without decreasing the productivity, defects that a resonant frequency of the hermetically encapsulated piezoelectric vibration element fixed within an insulating case by a silicon-based conductive adhesive is degraded over time, a piezoelectric vibrator, a piezoelectric oscillator, a frequency stabilization method, and a method of manufacturing the piezoelectric vibrator.

2. Related Art

A surface-mounted type piezoelectric device such as a crystal oscillator having a structure that the piezoelectric vibration element is hermetically encapsulated within the insulating case, is used as a reference frequency generation source, a filter or the like in an electronic apparatus like a computer or a communication apparatus like a cellular phone, a pager or the like. And miniaturization is also required on the piezoelectric device in response to the miniaturization of these various apparatuses.

In addition, a piezoelectric oscillator as a surface mounted piezoelectric device has a piezoelectric vibration element and circuit components constituting an oscillation circuit, which are received within a concave portion formed on a top surface of an insulating case formed of ceramic or the like, and an opening of the concave portion is encapsulated by a metal lid.

The piezoelectric vibration element has a structure that metal layers constituting an exciting electrode and a lead electrode are formed on a surface of a piezoelectric substrate, and the case is hermetically encapsulated while the piezoelectric vibration element is held on an inner electrode within the surface mounted type insulating case by means of a silicon based conductive adhesive (hereinafter, it will be referred to as a silicon adhesive).

FIG. 4 illustrates a phenomenon that the resonant frequency of the crystal oscillation element hermetically encapsulated within the insulating case is decreased, and it can be seen from FIG. 4 that the frequency decrease does not rapidly occur but gradually occurs over time.

That is, the tendency of the frequency decrease is hardly found in the phase that the crystal oscillator is manufactured by a piezoelectric device maker, however, it surfaces when the piezoelectric device has put on a printed board by an assembly maker and has circulated the market.

In addition, it was confirmed that the tendency of the frequency decrease becomes severe after a reflow process for loading the piezoelectric device on the printed board by the assembly maker. In addition, in response to miniaturization of the case of the crystal oscillator due to the recent requirement of miniaturization, a frequency of the occurrence of the frequency decrease actually increases.

Various inferences are drawn about the cause of these phenomena, however, an explicit cause is not found so that the fundamental solution cannot be obtained, which is the actual circumstance.

For example, a technique for solving the phenomenon of the frequency decrease of the crystal oscillator over the elapse of years is disclosed in the JP-A-7-154187.

According to this publication, it is understood that the cause of the frequency decrease of the crystal oscillator over the elapse of years lies in an oxidization phenomenon occurring on a surface layer of a metal layer constituting an electrode, so that the technique proposes attaching an insulating layer ($SiO_2$ layer) on the surface layer of the metal layer by a deposition or sputtering method so as to cover an entire surface of the layer or oxidizing, nitridizing, or carburizing the surface layer of the metal layer in advance to form a protective layer.

In addition, this oxidization phenomenon occurs only in a nickel portion educed up to a surface layer of a gold layer when the nickel base layer was formed below the gold layer. The gold portion except the nickel portion is stabilized so that it is not oxidized.

However, according to this related art, many problems occur as follows. That is, a strict thickness control is required when a $SiO_2$ layer is formed to cover a surface of the metal layer by deposition or the like. The $SiO_2$ layer is apt to be stripped because of its poor adhesiveness with the gold, and when a thickness of the $SiO_2$ layer is increased so as to prevent the $SiO_2$ layer from being striped from the surface of the gold, a residual stress occurs on the vibrator due to the layer stress. That is, a warpage occurs due to a temperature change to cause the temperature characteristic to be degraded. In addition, when the protective layer such as an oxide layer, a nitride layer, or a carbide layer is to be formed on the surface of the gold layer, the layer is formed only in the portion where the nickel is educed as described above, however, there exists an individual drift in an area of the portion where the nickel is educed, so that a drift occurs on the added mass of the protective layer, which thus causes the frequency to be adjusted. The protective layer is not formed in the gold layer portion where the nickel is not educed, so that the frequency decrease phenomenon over the elapse of years after encapsulation not solved due to the cause to be described later in the explanation of embodiments (that is, silicon molecules are gradually and chemically absorbed into the gold layer portion).

That is, the oxidation of the irregularly educed nickel portion on the surface of the gold layer is one of the causes of the frequency decrease, however, it has been found out that the cause is not a fundamental cause. Accordingly, the solution proposed by the above-described publication is not enough.

In addition, in order to slow down the speed of the resonant frequency decrease after hermetical encapsulation, it might be considered that silicon vapor be degassed (so-called annealing) from the insulating case prior to the encapsulation, however, the silicon vapor occurs so long as the silicon adhesive is present within the case even when the degassing was carried out, which gradually attaches to the exciting electrode layer to cause the frequency change. In addition, it might be considered that a kind of the adhesive be changed, however, the silicon adhesive is very effective in terms of satisfying an impact resistance property, so that an adhesive exceeding the performance of the silicon adhesive is not present in the actual circumstance.

SUMMARY

An advantage of some aspects of the invention is that it provides a crystal oscillator having a stabilized frequency over the elapse of years by understanding the cause of the frequency decrease of the piezoelectric vibrator over the elapse of years and planning to fundamentally prevent the frequency from decreasing.

Specifically, an advantage of some aspects of the invention is that it provides a piezoelectric vibration element, a piezoelectric vibrator, a piezoelectric oscillator, and a frequency stabilization method, which gas components emitted from a conductive bonding member are attached and deposited on a metal layer of the piezoelectric vibration element in a piezoelectric device having a hermetically encapsulated structure that the piezoelectric vibration element is held within an insulating case by the conductive bonding member to prevent the defect that the resonant frequency is decreased than a final target frequency over time.

A piezoelectric vibration element according to a first aspect of the invention includes a piezoelectric substrate formed of a thickness slip based piezoelectric material, and a metal layer formed on a surface of the piezoelectric substrate. In this case, a surface of the metal layer is covered by a layer formed by chemical absorption with a material having a nonbonding electron pair.

A piezoelectric vibration element according to a second aspect of the invention includes a piezoelectric substrate, and a piezoelectric vibration element having a metal layer formed on a surface of the piezoelectric substrate. In this case, a surface of the metal layer is covered by a layer formed by chemical absorption with a material having a nonbonding electron pair. An almost entire surface of the metal layer is covered by the layer so that a reduced amount of a resonant frequency is less than 1 ppm even when a layer is further formed on the surface of the metal layer that is not covered by the layer.

A piezoelectric vibrator according to a third aspect of the invention includes a piezoelectric vibration element according to the first aspect, and a case in which the piezoelectric vibration element is hermetically encapsulated.

A piezoelectric vibrator according to a fourth aspect of the invention includes the piezoelectric vibration element according to the first aspect, and a case receiving and hermetically encapsulating the piezoelectric vibration element in an inert gas while supporting the piezoelectric vibration element by means of a silicon based conductive adhesive.

A piezoelectric oscillator according to a fifth aspect of the invention includes an oscillation circuit component disposed inside or outside the case according to the third aspect.

A method of stabilizing a frequency of a piezoelectric vibration element according to a sixth aspect of the invention includes disposing the piezoelectric vibration element in an atmosphere of ring-shaped dimethylpolysiloxane vapor. In this case, the piezoelectric vibration element has a metal layer on a surface of a piezoelectric substrate formed of a thickness slip based piezoelectric material. And the method further includes making the ring-shaped dimethylpolysiloxane molecule subject to chemical absorption with a surface of the metal layer to form a layer of the ring-shaped dimethylpolysiloxane molecule.

A piezoelectric vibrator according to a seventh aspect of the invention includes a piezoelectric substrate formed of a thickness slip based piezoelectric material and a metal layer on a surface of the piezoelectric substrate, and a case in which the piezoelectric vibration element is held by a conductive bonding member. In this case, a surface of the metal layer exposed in an atmosphere is covered by a layer formed by chemical absorption with a material having a nonbonding electron pair.

A piezoelectric vibrator according to an eighth aspect of the invention includes a piezoelectric substrate and a metal layer on a surface of the piezoelectric substrate, and a case in which the piezoelectric vibration element is held by a conductive bonding member. In this case, a surface of the metal layer exposed in an atmosphere is covered by a monomolecular layer formed by chemical absorption with a material having a nonbonding electron pair. And an almost entire surface of the metal layer is covered by the monomolecular layer so that a reduced amount of a resonant frequency is less than 1 ppm even when a monomolecular layer is further formed on the surface of the metal layer that is not covered by the monomolecular layer.

According to a ninth aspect of the invention, the resonant frequency meets a target frequency in the air when an area of the entire surface of the metal layer occupied by the monomolecular layer corresponds to 100% of the entire surface of the metal layer in the piezoelectric vibrator according to the eighth aspect.

A piezoelectric vibrator according to a tenth aspect of the invention includes the piezoelectric vibration element according to the first aspect. In this case, the piezoelectric vibration element is hermetically encapsulated in a case.

A piezoelectric vibrator according to an eleventh aspect of the invention includes the piezoelectric vibration element according to the first aspect. In this case, the piezoelectric vibration element is held by means of a silicon based conductive adhesive and hermetically encapsulated in an inert gas atmosphere.

A piezoelectric oscillator according to a twelfth aspect of the invention includes an oscillation circuit component disposed inside or outside the case according to the seventh aspect.

A method of stabilizing a frequency of a piezoelectric vibration element according to a thirteenth aspect of the invention includes disposing the piezoelectric vibration element in an atmosphere of ring-shaped dimethylpolysiloxane vapor while supporting the piezoelectric vibration element in a case. In this case, the piezoelectric vibration element has a metal layer on a surface of a piezoelectric substrate formed of a thickness slip based piezoelectric material. And the method further includes making the ring-shaped dimethylpolysiloxane molecule subject to chemical absorption with a surface of the metal layer exposed in an atmosphere to form a monomolecular layer of the ring-shaped dimethylpolysiloxane molecule.

According to a fourteenth aspect of the invention, the monomolecular layer covers almost an entire surface of the metal layer so that a reduced amount of a resonant frequency is less than 1 ppm even when a layer is further formed on the surface of the metal layer that is not covered by the monomolecular layer in the method of stabilizing a frequency of a piezoelectric vibration element according to the thirteenth aspect.

A method of stabilizing a frequency of a piezoelectric vibration element according to a fifteenth aspect of the invention includes putting drops of a ring-shaped dimethylpolysiloxane solution into a case in which the piezoelectric vibration element having a metal layer formed on a surface of a piezoelectric substrate formed of a thickness slip based piezoelectric material is held by a silicon adhesive, and encapsulating the surface-mounted case. And the method further includes making the ring-shaped dimethylpolysiloxane molecule subject to chemical absorption with an exposed surface of the metal layer to form a layer of the ring-shaped dimethylpolysiloxane molecule.

According to a sixteenth aspect of the invention, the monomolecular layer covers almost an entire surface of the metal layer so that a reduced amount of a resonant frequency is less than 1 ppm even when a layer is further formed on the surface of the metal layer that is not covered by the monomolecular layer in the method of stabilizing a frequency of a piezoelectric vibration element according to the fifteenth aspect.

A method of manufacturing a piezoelectric vibrator according to a seventeenth aspect of the invention includes supporting a piezoelectric vibration element in a case by means of a conductive bonding member. In this case, the piezoelectric vibration element has a metal layer formed on a surface of a piezoelectric substrate formed of a thickness slip based piezoelectric material. And the method further includes adding or reducing a thickness of the metal layer so as to adjust a resonant frequency of the piezoelectric vibration element to a predetermined value, leaving the case by which the piezoelectric vibration element is held into an atmosphere filled with vapor of a material having a nonbonding electron pair. In this case, the resultantly exposed metal layer is subject to chemical absorption with the material having the nonbonding electron pair. And the method further includes hermetically encapsulating the case in a state substituted by an inert gas atmosphere.

A method of manufacturing a piezoelectric vibrator according to an eighteenth aspect of the invention includes supporting a piezoelectric vibration element in a case by means of a silicon based conductive adhesive. In this case, the piezoelectric vibration element has a metal layer formed on a surface of a piezoelectric substrate formed of a thickness slip based piezoelectric material. And the method further includes adding or reducing a thickness of the metal layer so as to adjust a resonant frequency of the piezoelectric vibration element to a predetermined value, hermetically encapsulating the case in a state substituted by an inert gas atmosphere, carrying out heating on the hermetically encapsulated case for a predetermined time, and chemically absorbing a material having a nonbonding electron pair transpirated from the silicon adhesive into the metal layer.

A method of manufacturing a piezoelectric vibrator according to a nineteenth aspect of the invention includes supporting a piezoelectric vibration element in a case by means of a silicon based conductive adhesive. In this case, the piezoelectric vibration element has a metal layer formed on a surface of a piezoelectric substrate formed of a thickness slip based piezoelectric material. And the method further includes adding or reducing a thickness of the metal layer so as to adjust a resonant frequency of the piezoelectric vibration element to a predetermined value, hermetically encapsulating the case in a state substituted by an inert gas atmosphere, leaving the hermetically encapsulated case in an atmosphere of temperature K for at least a time T, and chemically absorbing a resultant material having the nonbonding electron pair transpirated from the silicon adhesive into the metal layer. In this case, relationship between the temperature K and the time T meets $T=24294e^{-0.0251K}$.

A method of manufacturing a piezoelectric vibrator according to a twentieth aspect of the invention includes supporting a piezoelectric vibration element in a case by means of a silicon based conductive adhesive. In this case, the piezoelectric vibration element has a metal layer formed on a surface of a piezoelectric substrate formed of a thickness slip based piezoelectric material. And the method further includes adding or reducing a thickness of the metal layer so as to adjust a resonant frequency of the piezoelectric vibration element to a predetermined value, putting a material having a nonbonding electron pair into the case, hermetically encapsulating the case in a state substituted by an inert gas atmosphere, carrying out heating on the material having the nonbonding electron pair at a temperature required to transpirate the material for a predetermined time, and chemically absorbing the material having the nonbonding electron pair into the metal layer.

The silicon based conductive adhesive having a superior impact resistance property is very effective to fix the piezoelectric vibration element within the insulating case. And when the silicon vapor component emitted from the silicon based conductive adhesive when the insulating case is hermetically encapsulated is attached and deposited on the metal layer of the piezoelectric vibration element, the resonant frequency decreases below the final target frequency over time, which becomes the cause of mis-operation of an apparatus on which the piezoelectric device is loaded. According to the invention, it is possible to provide the piezoelectric vibration element, the piezoelectric vibrator, the piezoelectric oscillator, the frequency stabilization method, and the method of manufacturing the piezoelectric vibrator, which may form a layer formed of silicon molecules on a metal layer to saturate the amount of molecular absorption in a very short time ranging from several seconds to several minutes by low-cost apparatus and method using simple equipment and order, so that the decrease of the resonant frequency may be stopped to be stabilized, and the decrease of the productivity may not occur.

BRIEF DESCRIPTION OF THE DRAWINGS

The invention will be described with reference to the accompanying drawings, wherein like numbers reference like elements.

FIGS. 3A to 3C are views illustrating relationship between an ambient temperature and a period until the frequency of the piezoelectric vibration element reaches a stabilized region.

FIG. 4 is an explanatory view illustrating a phenomenon that the resonant frequency of the crystal oscillation element hermetically encapsulated within the insulating case is degraded.

DESCRIPTION OF EXEMPLARY EMBODIMENTS

Figure 1A:
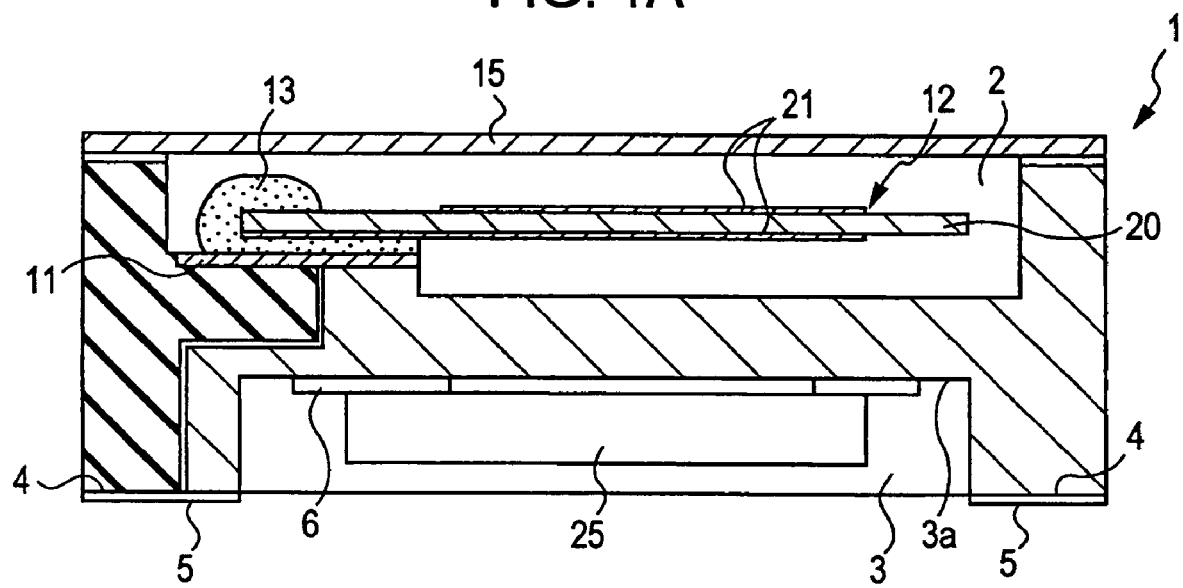
FIG. 1A is a cross-sectional view illustrating a structure of a quartz oscillator as an example of the surface-mounted type piezoelectric oscillator in accordance with an embodiment of the invention.

Prior to explanation of the exemplary embodiments, circumstances leading to the invention will be first described.

As described above, the frequency of the crystal oscillation element hermetically encapsulated within the case was continuously decreased over time in the related art, however, the cause was not revealed. Accordingly, research into the technique for solving such defects has been done in terms of only making the speed of frequency decrease slow down.

The inventors of the invention have continued to reveal the cause of frequency decrease, and have found for the first time that there exists a stabilized region after the frequency is decreased up to a predetermined value in a test of accelerating the aging (i.e., acceleration aging test) carried out in the research procedure, and no more frequency change occurred after the frequency reached the frequency stabilization region. The inventors, based on the discovery, have originated a technique that the frequency of the crystal oscillation element be decreased in advance before the element is shipped and the element be shipped after the frequency reaches the stabilization region.

As shown in FIG. 3, a period until the frequency reaches the stabilized region decreases as an ambient temperature rises. Accordingly, the cause of the frequency decrease of the conventional piezoelectric device after heating for reflow was significant was found.

When the heating temperature exceeded 230° C., the silicon adhesive might be deformed, so that it is preferable to carry out heating at 230° C. or less, and when the heating temperature actually exceeded 230° C., it was found that the frequency was still decreased below the frequency even after the frequency reached the frequency stabilization region as shown in FIG. 3A.

Accordingly, it was confirmed that the crystal oscillator having a less frequency change over time could be obtained by carrying out heating on the piezoelectric device until the frequency reaches the frequency stabilization region at a temperature of 230° C. or less.

According to the technique using the heating, it was confirmed that when the crystal oscillator was left at 230° C. for 70 hours, the resonant frequency reached the frequency stabilization region. However, such technique using the heating causes low production efficiency.

From the result of additional research based on the above-described research results, the inventors of the invention have found that a main cause of the frequency decrease over time was due to the added mass in response to the chemical absorption of the silicon molecule into the metal layer of the crystal oscillation element (e.g., the silicon molecule polymerized with 4 to 7 of a ring-shaped dimethylpolysiloxane molecule: dimethylpolysiloxane), and the silicon molecule is transpirated from silicon resin constituting a silicon resin conductive adhesive for bonding the crystal oscillation element onto the electrode within the case. And it is easy to set a concentration of the silicon molecules to be higher in a closed and smaller space, so that the cause of the frequency decrease in response to miniaturization of the case of the crystal oscillator was found.

In addition, it was revealed by the inventors of the invention that a phenomenon that a period of reaching the frequency stabilization region by means of heating is reduced was resulted from the acceleration of the silicon molecule transpirated from the silicon resin utilizing the heating.

However, the technique utilizing the heating requires a time of 70 hours at 230 even in the minimum level, so that the production efficiency is poor.

Accordingly, the inventors of the invention have originated a technique that the crystal oscillation received in the case in an opened state be exposed to an atmosphere filled with silicon vapor to fast attach the silicon molecule on the metal layer.

According to this technique, it was confirmed that the frequency of the crystal oscillation element reached a frequency stabilization region in several seconds, so that it may be a technique capable of implementing mass production.

Hereinafter, embodiments of the invention illustrated in the drawings will be described in detail.

Figure 1B:
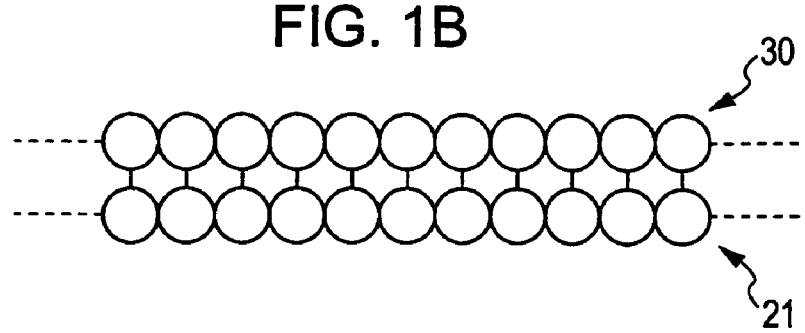
FIG. 1B is an enlarged view for explaining a main portion of FIG. 1A.

FIG. 1A is a cross-sectional view illustrating a structure of the quartz oscillator as an example of the surface mounted type piezoelectric oscillator in accordance with an embodiment of the invention, and FIG. 1B is a view illustrating the surface state of the exciting electrode layer in a molecular level.

The quartz oscillator (piezoelectric oscillator) includes concave portions 2 and 3 in its upper and lower portions, and includes an insulating case 1 (e.g., ceramic case) in which the vertical cross-section shape having four mounting terminals 5 on a ring-shaped bottom surface 4 is an approximate H-shape; a metal lid 15 hermetically encapsulating the upper concave portion 2 while electrically and mechanically connecting two exciting electrode layers 21 on the crystal oscillation element formed of a thickness slip based piezoelectric material, for example, the crystal oscillation element 12 (piezoelectric vibration element) composed of an AT-cut crystal substrate, to the two inner pads 11 disposed within the upper concave portion 2 by means of a silicon based conductive adhesive 13 (hereinafter, it will be referred to as a silicon adhesive); a lower pad 6 disposed on a ceiling surface 3a of the lower concave portion 3 and electrically connected to the respective inner pads 11 and the respective mounting terminals 5; and an IC component 25 constituting the oscillation circuit mounted on the lower pad 6.

A mounting terminal on the side of the crystal oscillator among the mounting terminals 5 is electrically connected to one side of the inner pad 11.

An upper portion of the insulating case 1 having an upper concave portion 2, inner pads 11, a crystal oscillation element 12, and a metal lid 15 constitutes a crystal oscillator (i.e., piezoelectric vibrator). That is, the crystal oscillation element 12 is electrically and mechanically connected to the inner electrode 11 within the upper concave portion 2 of the insulating case 1 formed of an insulating material like ceramic by means of a silicon adhesive 13, and the metal lid 15 is electrically and mechanically connected to a conductive ring of the upper surface of the outer wall of the insulating case 1 by means of welding or the like to hermetically encapsulate the concave portion 2, thereby obtaining the crystal oscillator. The crystal oscillation element 12 has an exciting electrode layer 21 (metal layer) formed of a metal material like gold on inside and outside surfaces of the crystal substrate 20 (piezoelectric substrate) as the thickness slip based piezoelectric material, and a lead electrode 22 extended to the substrate edge from the exciting electrode layer 21.

As described above, the cause of the phenomenon that the frequency is degraded over time after the crystal oscillation element is hermetically encapsulated within the case has been implicit, however, according to researches of the present inventors, it is inferred that silicon molecules in the ring-shaped dimethylpolysiloxane vapor (hereinafter, referred to as silicon vapor) generated from the silicon adhesive 13 and filled within the case are gradually and chemically absorbed into a surface of the exciting electrode layer.

That is, the silicon adhesive 13 is a conductive adhesive that a silver filler is mixed with a silicon resin, and emits silicon vapor from the silicon resin by heating at the time of mounting the quartz oscillator on a motherboard by reflow or by heating at the time of mounting the IC component 25 on a flip chip in the room temperature. The emitted silicon vapor is diffused into the insulating case 1 encapsulated by the lid 15 as described above. The silicon molecule 30 having the non-bonding electron pair has a property that is apt to be chemically absorbed with a surface of the metal constituting the exciting electrode layer 21 (metal layer), and when the silicon molecular layer is absorbed to the surface of the exciting electrode layer by a predetermined amount or more, a defect occurs that the oscillation frequency of the quartz oscillator as a completed product is degraded over time. Such defect becomes severe in the current state that the insulating case is micro-miniaturized to cause its inner volume to be extremely minimized.

According to the first embodiment of the invention for coping with such defects, there is provided a method of stabilizing the frequency in advance by means of heating before getting a piezoelectric device on the market. That is, according to this method, the piezoelectric device is subject to heating for 70 hours or more at a temperature lower than a silicon pyrolysis temperature, for example, at 230° C. among temperatures higher than the room temperature, preferably among temperatures exceeding the boiling point of the silicon molecule (e.g., 188° C. at D3) while encapsulating the piezoelectric device, so that silicon vapor may be positively emitted from the silicon adhesive within the hermetically encapsulated insulating case, which thus allows the amount of absorbing the silicon molecule into the surface of the exciting electrode layer in a unit time to be increased by increasing the concentration of the silicon vapor for a short time as compared to a case of natural aging. As a result, the time required for reaching the frequency stabilization region (state) may be significantly reduced to reduce the time up to the shipment, thereby capable of enhancing the total productivity.

That is, according to the first embodiment, a process of supporting the crystal oscillation element 12 (i.e., piezoelectric vibration element) within the case 12 by means of the silicon adhesive 13 (i.e., conductive bonding member), the crystal oscillation element having the exciting electrode layer 21 as a metal layer (i.e., the layer having gold on a surface of the base layer such as nickel or chrome) formed on the surface of the piezoelectric substrate formed of a thickness slip based piezoelectric material such as a crystal substrate 20 or the like, a process of adding or reducing the thickness of the exciting electrode layer 21 so as to adjust the resonant frequency of the crystal oscillation element 12 to a predetermined value (i.e., a value higher than the resonant frequency of the crystal oscillation element at the time of manufacture completion), a process of hermetically encapsulating the case 1 in the state substituted by the inert gas atmosphere, and a process of heating the hermetically encapsulated case 1 for a predetermined time to chemically absorb the material having the nonbonding electron pair (i.e., silicon molecule) transpirated from the silicon adhesive into the exciting electrode layer, are sequentially carried out.

Figure 3C:
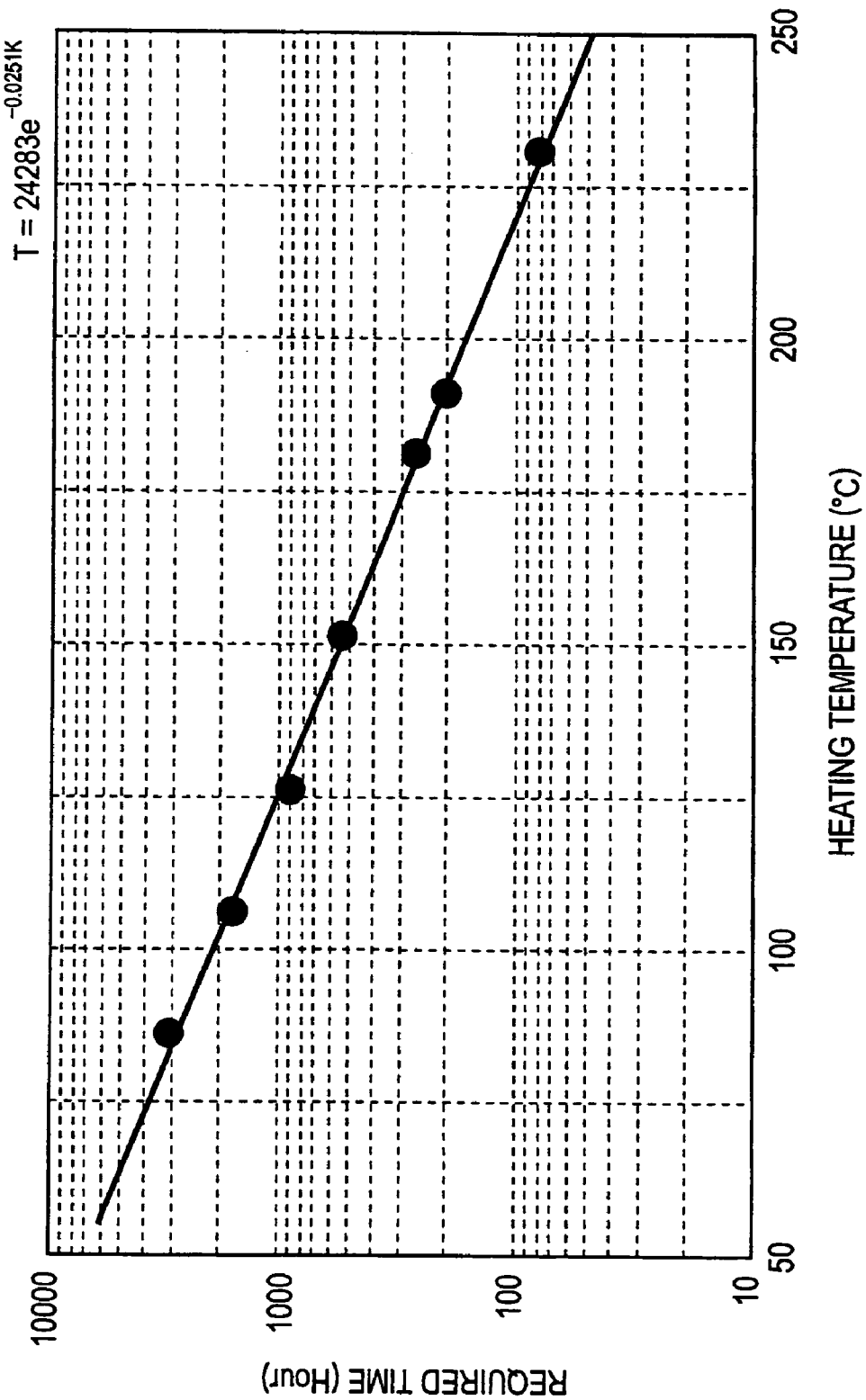

FIG. 3A illustrates relationship between differences of heating temperature and characteristics of varying resonant frequencies in the crystal oscillation element having the resonant frequency of 26 MHz. FIG. 3B illustrates results of the measured time until the resonant frequency of the crystal oscillation element reaches almost a uniform value (i.e., the resonant frequency having the reduced amount of about −4 ppm from the start of the heating) during the heating. FIG. 3C illustrates an approximation line representing the relationship between the heating temperature and the heating time by plotting the measured results of FIG. 3B.

As shown in FIG. 3A, when the heating temperature was not more than 230° C., the resonant frequency was decreased right after the heating was commenced, however, when a specific time was passed, it was seen that the reduced amount of the resonant frequency was decreased and the resonant frequency was stabilized.

In addition, when the heating temperature is not more than 230° C., the reduced amount of frequency until the frequency becomes stabilized is uniform regardless of the heating temperature, and the reduced amount of frequency until the frequency stabilization was, for example, about −4 ppm in a case of the resonant frequency of 26 MHz.

When the heating temperature is higher than 230° C., for example, when it is 250° C., 270° C., or 300° C., a rapid frequency decrease occurred after the heating is commenced in all of the cases, so that the frequency was not stabilized after the same amount of frequency was decreased.

Accordingly, it can be seen that a heating time required for reaching the frequency stabilization is present after the frequency decreases by a specific frequency when the crystal oscillation element is heated based on the result at a temperature not more than 230° C.

Accordingly, values indicated in FIG. 3B could be obtained by measuring the time required for the resonant frequency to be stabilized (i.e., the state that the frequency is decreased by −4 ppm after the heating is commenced) in each condition of the heating temperature.

In addition, the relationship between the heating temperature and the time required for reaching the frequency stabilization was illustrated as an approximation line in FIG. 3C based on numeral data indicated in FIG. 3B.

It was seen that that the time T required for reaching the frequency stabilization in the relationship with the heating temperature K from the approximation line is $24294e^{-0.0251K}$.

That is, according to the heating method of the absorption process, the material having the nonbonding electron pair transpirated from the silicon based conductive adhesive (i.e., conductive bonding member) 13 by leaving the hermetically encapsulated case 1 in an atmosphere having a temperature of K for a time T is preferably subject to chemical absorption with the exciting electrode layer 20 (i.e., metal layer) to meet the relationship between the temperature K and the time T such as $T=24294e^{-0.0251K}$ (25° C.<K≦230° C.).

Next, according to a second embodiment of the invention, a technique of accelerating the silicon molecular absorption is provided instead of heating, which makes the frequency of the crystal oscillation element reach the frequency stabilization region for a short time.

That is, in the present embodiment, the monomolecular layer 30 of the silicon molecule is formed in advance to cover the entire surface of the exciting electrode layer 21 by exposing the exciting electrode layer 21 to an atmosphere of the silicon vapor prepared in advance before encapsulating the insulating case 1. According to this structure, a long term heating process for making the concave portion 2 of the insulating case 1 subject to the atmosphere of silicon vapor, which has been required in the first embodiment, is not necessary, so that the resonant frequency of the crystal oscillation element may be reduced to a predetermined target value (target frequency) at one time from the set value at the time of frequency adjustment stroke to be stabilized. In addition, the predetermined target frequency is a resonant frequency of the crystal oscillation element 12 right before the encapsulation with the metal lid 15 (i.e., the state that the frequency adjustment due to the mass addition is completed), and is almost equal to the resonant frequency in the hermetically encapsulated state in an inert gas atmosphere within the insulating case when the resonant frequency is measured in the air, however, has a value higher than the target frequency in the air by several ppm as is known in the vacuum encapsulated state.

In addition, the target frequency is a resonant frequency in a state that no material effecting mass addition except the silicon monomolecular layer 30 is attached on the surface of the exciting electrode layer 21, that is, a state that no other material is deposited on the silicon monomolecular layer 30.

That is, atoms of the metal material including gold has a dangling bond and is apt to be chemically absorbed with the material having the nonbonding electron pair, so that the dangling bond of all metal atoms 21 disposed on a surface of the exciting electrode is absorbed with the nonbonding electron pair of the silicon molecule 30 in a very short time (several seconds) (i.e., the state is seen in FIG. 1B) as long as the surface of the exciting electrode layer is exposed for a short time to an atmosphere in which the silicon vapor concentration is higher than a predetermined value or more, whereby the resultant monomolecular layer 30 is formed on an entire surface of the exciting electrode layer in a short time. Since the number of the dangling bond on the surface of the lead electrode and the surface of the exciting electrode is limited and the silicon molecule forming the monomolecular layer 30 of silicon formed on the entire surface of the exciting electrode layer by the chemical absorption does not have an absorption means (i.e., electron pair), the silicon molecule does not overlap the monomolecular layer 30 to be chemically absorbed, and the number of the attachable silicon molecules (thickness and mass of the monomolecular layer) is determined in terms of the fact that a new silicon layer is not formed, so that the resonant frequency is not decreased due to the chemical absorption after the entire surface of the exciting electrode is covered with the silicon molecule. In addition, since the monomolecular layer 30 has a thickness corresponding to one silicon molecule as shown in FIG. 1B, the thickness needs not to be controlled. As such, the thickness of the monomolecular layer 30 may be determined in advance, so that the reduced amount of the resonant frequency of the crystal oscillation element due to the monomolecular layer 30 may be correctly predicted or calculated, and the frequency may be set to be higher than the target frequency in advance when the frequency needs to be adjusted so that the resonant frequency at the time that the monomolecular layer 30 is formed becomes the target frequency. Accordingly, the crystal oscillator having the stabilized frequency, and the quartz oscillator may be manufactured with a good yield. Meanwhile, the crystal material forming the crystal substrate is a crystalline structure of $SiO_2$ that does not have the dangling bond, so that the silicon molecule cannot be chemically absorbed with a surface of the crystal substrate.

FIG. 2 is s schematic view illustrating a manufacture process including a process of forming the silicon monomolecular layer on the exciting electrode layer of the crystal oscillation element in the invention.

In the process of processing the crystal substrate wafer (FIG. 2A), electrode formation is carried out on each piece region 36 on the crystal wafer 35 of large area by means of etching, deposition or the like of the photolithography technique to form each piece of the crystal oscillation element while a frequency adjustment process (i.e., the process of adding or reducing the thickness of the exciting electrode layer) is carried out to set the resonant frequency of each piece to be higher than the target frequency by a predetermined frequency. The predetermined frequency higher than the target frequency is a final target frequency, and is a frequency in a state in which the insulating case filled with an inert gas is hermetically encapsulated by the lid after the remaining silicon component attached on the silicon monomolecular layer (i.e., silicon component that is not chemically absorbed) is removed after the monomolecular layer is formed on an entire surface of the exciting electrode layer within the chamber and then opened to the air, which will be described later.

A piezoelectric material used as the substrate material is not limited to quartz when it is the thickness slip based piezoelectric material of which the frequency is determined by the thickness difference. An electrode material used for the exciting electrode may employ gold, aluminum or the like, however, any metal may be employed when the metal is capable of being chemically absorbed with the silicon vapor.

In the process of dividing into each piece (FIG. 2B), the crystal wafer is divided by dicing, etching, or the like along the boundary of each piece region.

In the next process (FIG. 2C) (i.e., supporting process), the divided crystal oscillation element 12 is connected onto the internal electrode 11 within an upper concave portion 2 of the insulating case 1 by a silicon adhesive 13 (i.e., conductive bonding member).

Figure 2A:
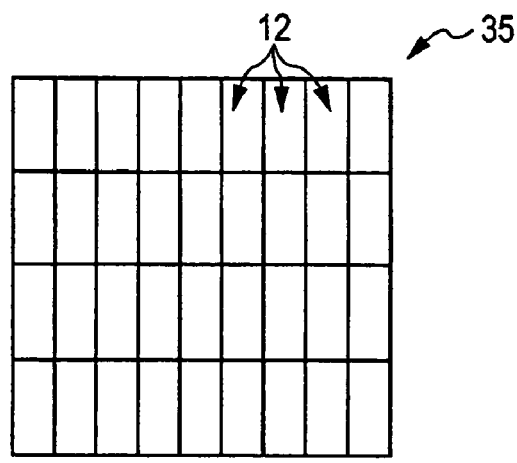
FIGS. 2A to 2D are explanatory views illustrating a manufacture process including a process of forming a silicon monomolecular layer on an exciting electrode layer of the crystal oscillation element in the invention.
Figure 2B:
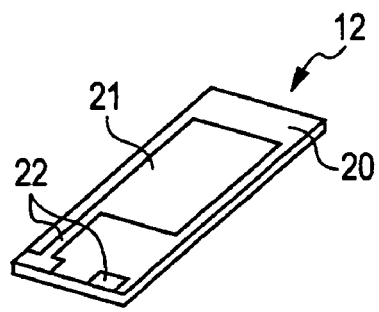
Figure 2C:
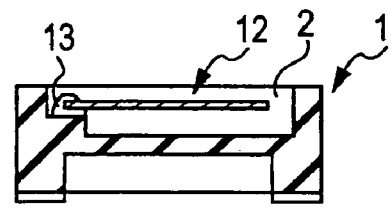
Figure 2D:
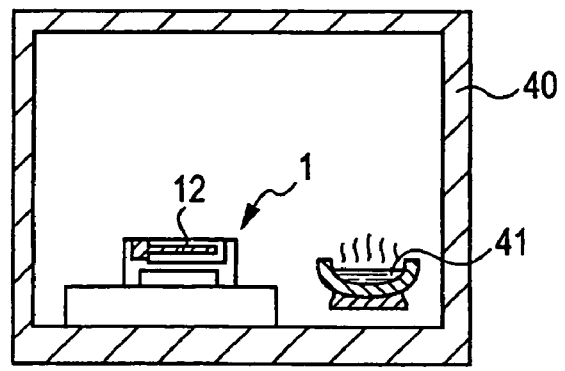

In the next process of forming the silicon monomolecular layer (i.e., absorption process; FIG. 2D), the insulating case 1 supporting the crystal oscillation element 12 inside is disposed within the chamber 40 filled with silicon vapor (i.e., vapor of the material having the nonbonding electron pair) as shown in FIG. 2D, and the silicon molecule is chemically absorbed to the surface of the exciting electrode layer 21, thereby forming a monomolecular layer having a uniform thickness. Accordingly, the silicon monomolecular layer 30 having the uniform thickness is formed on en entire surface of the exciting electrode layer.

A high volatile material having a low molecular amount (a degree of polymerization n of $[(CH_3)_2SiO]_n$:$D_n$ is 4 to 7) is preferably employed as the silicon. In addition, the silicon is apt to be volatile at room temperature, however, in a case of the silicon having the degree of polymerization D5, its boiling point is 211° C., so that the silicon vapor $[CH_5]_2SiO]_5$ with a desired concentration may be filled within the chamber in a short time by heating the undiluted solution of silicon 41 within the chamber 40 to the boiling point or any temperature not higher than the boiling point, and when the concentration (ppm) is increased, the time for forming the monomolecular layer (i.e., the time required for saturation) may be decreased. The temperature within the chamber may be a room temperature, or may be increased so as to safely keep the silicon vapor state.

Each metal atom constituting a surface layer of the exciting electrode layer 21 and a surface layer of the lead electrode 22 has a dangling bond. The nonbonding electron pair on the side of the silicon molecule is hung and chemically absorbed to the dangling bond, so that the exciting electrode layer 21 and the stabilized monomolecular layer 30 that is not easily separated from the lead electrode 22 may be obtained. In a state that all dangling bonds are absorbed with the silicon molecule, the silicon molecule is not chemically absorbed any more, however, in a state that a concentration of the silicon molecule within the chamber is high, the silicon molecule floating in the chamber is attached to and deposited on (physically attached to) the silicon monomolecular layer 30, so that the frequency in a case that other silicon components are deposited on the silicon monomolecular layer is affected by the mass addition of the physical attachment and is lowered as compared to the frequency in a case that only the silicon monomolecular layer 30 is chemically absorbed on the exciting electrode. Accordingly, when only the silicon component deposited by the physical attachment is dispersed (i.e., evaporated) to be removed by opening the silicon monomolecular layer to the air (in dry gas) outside the chamber after the formation of the silicon monomolecular layer, the thickness of the silicon monomolecular layer 30 needs not to be accurately managed at the time of forming the silicon monomolecular layer 30, so that the silicon monomolecular layer 30 having a desired thickness may be easily configured while a desired target frequency may be easily obtained. In this case, the target frequency becomes the final target frequency as it is when the layer is filled with the inert gas within the insulating case because the target frequency is a resonant frequency in the air, however, when the layer is encapsulated in a vacuum state, it is possible to meet the frequency of the vacuum encapsulation with the final target frequency by setting the resonant frequency in the air to the target frequency offset by the reduced amount due to the vacuum encapsulation.

When a layer is formed by a physical absorption technique such as deposition or sputter only for increasing the mass of the exciting electrode, it is difficult to form it as a monomolecular layer (i.e., a single layer) so that it is apt to have multiple layers, which causes it difficult to strictly manage the thickness, however, the silicon monomolecular layer has the uniform thickness almost same as the thickness of the monomolecule, so that the layer thickness or layer formation time needs not to be strictly monitored nor measured. By setting the thickness of a vibration unit of the crystal substrate to a predetermined value in advance, that is, by setting the thickness of the vibration unit of the crystal substrate so as to obtain the target resonant frequency after adding the area (mass) of the exciting electrode to be formed in the vibration unit and the reduced amount of frequency due to the mass of the silicon monomolecular layer absorbed on the entire surface of the area, the frequency accuracy may be readily secured.

That is, the thickness of (i.e., a magnitude of the monomolecule) the silicon monomolecular layer 30 is about 1.3 nm when a degree of polymerization of the silicon is D4. As such, in case of the monomolecular layer, its thickness and the reduced amount of the frequency may be accurately predicted, so that the resonant frequency prior to the formation of the silicon monomolecular layer is set to be high to some extents, which thus facilitates setting the frequency to the target frequency after the formation of the silicon monomolecular layer. For example, a result may be obtained that the resonant frequency (e.g., 26 MHz) at the time that the silicon monomolecular layer 30 is formed on an entire surface of the exciting electrode layer is low by 5 ppm as compared to the resonant frequency prior to the formation of the silicon monomolecular layer, and the uniform frequency reduction between media occurs with respect to the crystal oscillation element having the same dimensional structure with the same resonant frequency, so that the fine adjustment of the frequency becomes very facilitated.

It can be seen by the acceleration aging test for a long period that, after the monomolecular layer is formed to stabilize the frequency, 1 ppm is changed, for example, in 50 years and another 1 ppm is changed in about 500 years. As such, the state after saturation is stabilized, so that there occurs no problems in the reliability test and temperature cycle.

When the silicon monomolecular layer is formed on the exciting electrode of the crystal oscillation element in the process of forming the silicon monomolecular layer, a concentration of the silicon vapor is set to a predetermined value or higher, so that the silicon monomolecular layer is formed on the entire surface of the exciting electrode after several seconds, which thus allows the area occupied by the monomolecular layer on the entire surface of the exciting electrode to be a maximum area corresponding to 100% of the entire surface of the exciting electrode.

When the resonant frequency capable of being obtained by forming a silicon monomolecular layer having an occupancy of a range that does not reach the maximum area (100%) (i.e., the resonant frequency of the crystal oscillation element in the state that the exciting electrode is not partially covered by the silicon monomolecular layer) is higher than the resonant frequency of the piezoelectric vibration element having the maximum area (i.e., the exciting electrode is fully covered by the monomolecular layer) within a range of +1 ppm to 0 ppm, even when the occupied area of the silicon monomolecular layer on the entire surface of the exciting electrode is less than 100%, the resonant frequency is then allowable within the range of ±1 ppm (i.e., the general drift range capable of compensating the operation) of the target frequency for 50 years (by the acceleration aging test) even when the resonant frequency is reduced, so that there occurs no problems in the operation of the apparatus having the built-in crystal oscillator until the apparatus reaches its lifetime. That is, almost an entire surface of the exciting electrode layer is preferably covered by the monomolecular layer so that the reduced amount of the resonant frequency is less than 1 ppm even when a layer is further formed on the surface of the exciting electrode layer that is not covered by the silicon monomolecular layer 30.

In addition, in the process (FIG. 2D) of forming the silicon monomolecular layer, the silicon monomolecular layer is formed within the chamber 40, which is then opened to the air and dried, so that the silicon component attached on the monomolecular layer is dispersed to be removed.

In the final encapsulation process, the opening is encapsulated by the lid in the state that the inert gas such as nitrogen is filled within the insulating case, which is shown in FIG. 1A.

Each process shown in FIG. 2 may be configured to be carried out in response to a series of manufacture lines, so that the manufacture apparatus and method having a high productivity may be implemented.

In the manufacture apparatus or method shown in FIG. 2D, the piezoelectric vibration element 12 having the exciting electrode layer 21 (metal layer) on the surface of the crystal substrate 20 formed of the thickness slip piezoelectric material is disposed in the chamber 40 in a high concentration atmosphere of the silicon vapor (ring-shaped dimethylpolysiloxane vapor), and the silicon molecule is chemically absorbed into the surface of the exciting electrode layer to form the monomolecular layer 30 of the silicon molecule, which is, however, only an example, and other apparatus configuration and method may be applied for forming the monomolecular layer. For example, a very small amount of undiluted solution of silicon may be dropped into the insulating case 1 in which the piezoelectric vibration element 12 having the exciting electrode layer 21 on the surface of the piezoelectric substrate 20 formed of the thickness slip based piezoelectric material is held by the silicon adhesive so that the insulating case is encapsulated, which may be heated to a temperature suitable for transpirating the undiluted solution of silicon, if necessary, so as to chemically absorb the silicon molecule into the surface of the exciting electrode layer so that the monomolecular layer of the silicon molecule may be formed.

That is, the manufacture method according to the present embodiment includes supporting the crystal oscillation element 12 (i.e., a piezoelectric vibration element) in the case 1 by means of the silicon based conductive adhesive 13 (i.e., a conductive bonding member), the crystal oscillation element having the exciting electrode layer 21 as a metal layer on the surface of the crystal substrate 20 as the piezoelectric substrate formed of a thickness slip based piezoelectric material; adding or reducing the thickness of the exciting electrode layer 21 so as to adjust the resonant frequency of the piezoelectric vibration element 12 to a predetermined value; putting the material having the nonbonding electron pair into the case 1; hermetically encapsulating the case 1 in a state substituted by the inert gas atmosphere; and heating the material having the nonbonding electron pair at a temperature required to transpirate the material, and chemically absorbing the material into the exciting electrode layer 21.

In this case, an area occupied by the monomolecular layer on the entire surface of the metal layer is not necessarily the maximum area (i.e., 100%), and when an amount of the resonant frequency of the piezoelectric vibration element having the maximum area is reduced by 1 ppm (i.e., an allowable range of the unit) within an allowable range, there is no problems in the unit within the allowable range even when the area occupied by the silicon monomolecular layer on the entire surface of the exciting electrode is less than 100%. That is, almost an entire surface of the exciting electrode layer is preferably covered by the monomolecular layer so that the reduced amount of the resonant frequency is less than 1 ppm even when a layer is further formed on the surface of the exciting electrode layer that is not covered by the silicon monomolecular layer 30.

In addition, a material to be chemically absorbed into the exciting electrode to form the monomolecular layer is not limited to the silicon but may be any material having a nonbonding electron pair. Accordingly, the conductive bonding member for supporting the piezoelectric vibration element in the case in each of the embodiments described above is not limited to the silicon adhesive but may also be any adhesive for generating the material having a nonbonding electron pair.

What is claimed is:

1. A piezoelectric vibration element, comprising:
   a piezoelectric substrate formed of a thickness slip based piezoelectric material; and
   a metal layer formed on a surface of the piezoelectric substrate,
   wherein a surface of the metal layer is covered by a layer formed by chemical absorption with a material having a nonbonding electron pair.

2. A piezoelectric vibration element, comprising:
   a piezoelectric substrate; and
   a piezoelectric vibration element having a metal layer formed on a surface of the piezoelectric substrate,
   wherein a surface of the metal layer is covered by a layer formed by chemical absorption with a material having a nonbonding electron pair, and an almost entire surface of the metal layer is covered by the layer so that a reduced amount of a resonant frequency is less than 1 ppm even when a layer is further formed on the surface of the metal layer that is not covered by the layer.

3. A piezoelectric vibrator, comprising:
   the piezoelectric vibration element according to claim 1; and
   a case in which the piezoelectric vibration element is hermetically encapsulated.

4. A piezoelectric vibrator, comprising:
   the piezoelectric vibration element according to claim 1; and
   a case receiving and hermetically encapsulating the piezoelectric vibration element in an inert gas while supporting the piezoelectric vibration element by means of a silicon based conductive adhesive.

5. A piezoelectric oscillator, comprising:
   an oscillation circuit component disposed inside or outside the case according to claim 3.

6. A piezoelectric vibrator, comprising:
   a piezoelectric vibration element having a piezoelectric substrate formed of a thickness slip based piezoelectric material and a metal layer on a surface of the piezoelectric substrate; and
   a case in which the piezoelectric vibration element is held by a conductive bonding member,
   wherein a surface of the metal layer exposed in an atmosphere is covered by a layer formed by chemical absorption with a material having a nonbonding electron pair.

7. A piezoelectric vibrator, comprising:
   a piezoelectric vibration element having a piezoelectric substrate and a metal layer on a surface of the piezoelectric substrate; and
   a case in which the piezoelectric vibration element is held by a conductive bonding member,
   wherein a surface of the metal layer exposed in an atmosphere is covered by a monomolecular layer formed by chemical absorption with a material having a nonbonding electron pair, and an almost entire surface of the metal layer is covered by the monomolecular layer so that a reduced amount of a resonant frequency is less than 1 ppm even when a monomolecular layer is further formed on the surface of the metal layer that is not covered by the monomolecular layer.

8. The piezoelectric vibrator according to claim 7, wherein the resonant frequency meets a target frequency in the air when an area of the entire surface of the metal layer occupied by the monomolecular layer corresponds to 100% of the entire surface of the metal layer.

9. A piezoelectric vibrator, comprising:
   the piezoelectric vibration element according to claim 1 hermetically encapsulated in a case.

10. A piezoelectric vibrator, comprising:
    the piezoelectric vibration element according to claim 1, the piezoelectric vibration element being held by means of a silicon based conductive adhesive and hermetically encapsulated in an inert gas atmosphere.

11. A piezoelectric oscillator, comprising:
    an oscillation circuit component disposed inside or outside the case according to claim 6.

* * * * *